United States Patent [19]
Goller et al.

[11] Patent Number: 5,504,699
[45] Date of Patent: Apr. 2, 1996

[54] NONVOLATILE MAGNETIC ANALOG MEMORY

[76] Inventors: Stuart E. Goller, 1340 S. Beverly Glen #114, Los Angeles, Calif. 90024; Frank Powell, 113 Thorndike Way, Folsom, Calif. 95630

[21] Appl. No.: 224,907

[22] Filed: Apr. 8, 1994

[51] Int. Cl.$^6$ .................................................. G11C 13/00
[52] U.S. Cl. .................... 365/48; 365/66; 365/135
[58] Field of Search ................... 365/157, 48, 66, 365/97, 130, 97, 98, 99, 134, 135

[56] References Cited

U.S. PATENT DOCUMENTS

| | | | |
|---|---|---|---|
| H1,035 | 3/1992 | Haviland et al. | 365/45 |
| 2,736,880 | 2/1956 | Forrester | 365/130 |
| 2,889,540 | 6/1959 | Bauer et al. | 365/130 |
| 3,422,400 | 6/1969 | Corljnen | 365/145 |
| 3,426,255 | 2/1969 | Heywang | 317/235 |
| 3,476,951 | 6/1969 | Pulvari | 307/401 |
| 3,502,992 | 6/1970 | Cooperman | 328/151 |
| 3,521,255 | 7/1970 | Arndt | 340/174 |
| 3,584,209 | 7/1971 | La Garde | 364/829 |
| 3,585,611 | 7/1971 | Lefkowitz | 365/145 |
| 3,587,070 | 7/1971 | Thomas | 365/66 |
| 3,623,030 | 8/1971 | Sawyer | 365/145 |
| 3,631,412 | 7/1971 | Harding | 365/130 |
| 3,651,494 | 7/1972 | Lynch | 365/145 |
| 3,668,670 | 7/1972 | Anderson | 360/112 |
| 3,683,340 | 6/1970 | Dorsch | 340/174 |
| 3,691,535 | 7/1972 | Williams | 365/184 |
| 3,701,122 | 1/1972 | Geusic | 365/110 |
| 3,735,369 | 7/1973 | Iida | 365/157 |
| 3,737,775 | 6/1973 | Mangold et al. | 325/37 |
| 3,820,088 | 7/1974 | Hadni | 365/110 |
| 3,832,700 | 8/1974 | Wu et al. | 340/173.2 |
| 3,835,376 | 9/1974 | Kataoka | 324/252 |
| 3,838,477 | 7/1974 | Wray | 360/26 |
| 3,846,770 | 8/1974 | Schwee | 365/88 |
| 3,866,189 | 7/1975 | Berger | 365/145 |
| 3,902,166 | 7/1975 | Kiyasu | 365/10 |
| 3,909,806 | 9/1975 | Ucida | 365/45 |
| 3,953,837 | 8/1976 | Cheek | 365/238 |
| 3,965,463 | 7/1975 | Chauohari et al. | 340/174 |
| 3,971,055 | 4/1976 | Arai | 257/272 |
| 3,973,182 | 7/1976 | Kataoka | 324/251 |
| 3,979,738 | 5/1976 | Feuersanger | 365/12 |
| 3,990,057 | 8/1976 | Kumada | 365/45 |

(List continued on next page.)

OTHER PUBLICATIONS

Kaufman, "Obtaining Nondestructive Readout With Ferroelectric Memories" Electonics Magazine vol. 34 pp. 47–51 Aug. 25, 1961.

C. C. Hansen "Core Memory Stores Analog Signals" Control Engineering Magazine vol.: 14 pp. 87–90 Sep. 1967.

*Primary Examiner*—Terrell W. Fears

[57] ABSTRACT

A nonvolatile analog magnetic memory includes a substrate comprised of saturable and desaturable magnetic domains at distinguishable fixed locations, a bi-directional drive circuit to selectively write data to the magnetic domains by first saturating a selected magnetic domain with current flowing in one direction, followed by desaturating the magnetic domain with current flowing in the reverse direction of the saturating current, lowering the magnetic flux density to a level corresponding to the magnitude of an analog input electrical signal within a range of magnetic flux density levels between a zero point and a full scale point, sensors and a sensor select circuit to select a magnetic domain and nondestructively respond to the magnitude of the magnetic flux for the chosen magnetic domain, producing an electrical output signal corresponding to the magnetic flux for the chosen magnetic domain. A second embodiment includes a rotatable substrate, a bi-directional drive circuit on a read/write head sensor and a sensor select circuit. In both embodiments superconductive materials can be incorporated into the magnetic domain material, the bi-directional drive circuit, and sensors and sensor select circuitry. All components of the nonvolatile analog magnetic memory can be formed through photo-lithographic techniques, sputtering, and machine, electromechanical, or manual assembly. Cells of magnetic domain material can be arranged in both serial and parallel form for analog nonvolatile writing and reading.

13 Claims, 20 Drawing Sheets

U.S. PATENT DOCUMENTS

| | | | |
|---|---|---|---|
| 4,031,525 | 7/1977 | Voltz | 365/133 |
| 4,054,864 | 9/1977 | Audaire | 365/45 |
| 4,092,734 | 6/1978 | Collins | 365/183 |
| 4,097,753 | 8/1978 | Schuster | 307/359 |
| 4,099,251 | 2/1978 | Shunji | 364/829 |
| 4,144,591 | 6/1979 | Brody | 365/228 |
| 4,164,023 | 7/1979 | Whitehouse | 364/862 |
| 4,169,258 | 6/1979 | Tannas | 365/145 |
| 4,181,980 | 3/1980 | McCoy | 365/45 |
| 4,259,728 | 3/1981 | Geary | 365/45 |
| 4,272,831 | 3/1981 | Ullrich | 365/45 |
| 4,313,178 | 1/1982 | Stern | 365/183 |
| 4,323,984 | 9/1982 | Ishihara | 365/10 |
| 4,445,189 | 4/1984 | Hyatt | 364/600 |
| 4,558,431 | 12/1985 | Satoh | 365/45 |
| 4,573,142 | 2/1986 | Azegami | 365/45 |
| 4,607,271 | 8/1986 | Popovic et al. | 357/27 |
| 4,627,027 | 12/1986 | Kitamura | 365/45 |
| 4,649,072 | 3/1987 | Yamaguchi | 428/212 |
| 4,660,172 | 4/1987 | Holzer | 365/2 |
| 4,747,075 | 5/1988 | Berggren | 365/45 |
| 4,791,604 | 12/1988 | Lienam et al | 365/9 |
| 4,809,223 | 2/1989 | Brown | 365/45 |
| 4,811,285 | 3/1989 | Walker | 365/45 |
| 4,823,313 | 4/1989 | Kadota | 365/49 |
| 4,860,254 | 8/1989 | Pott | 365/145 |
| 4,873,664 | 10/1989 | Eaton | 365/145 |
| 4,888,733 | 3/1989 | Mobley | 365/145 |
| 4,890,259 | 12/1989 | Simko | 365/45 |
| 4,893,272 | 1/1990 | Eaton et al. | 365/145 |
| 4,910,706 | 3/1980 | Hyatt | 365/45 |
| 4,999,692 | 3/1991 | Ristic et al. | 357/27 |
| 5,025,416 | 6/1991 | Prinz | 365/170 |
| 5,068,826 | 11/1991 | Matthews | 365/170 |
| 5,075,247 | 12/1991 | Matthews | 437/52 |

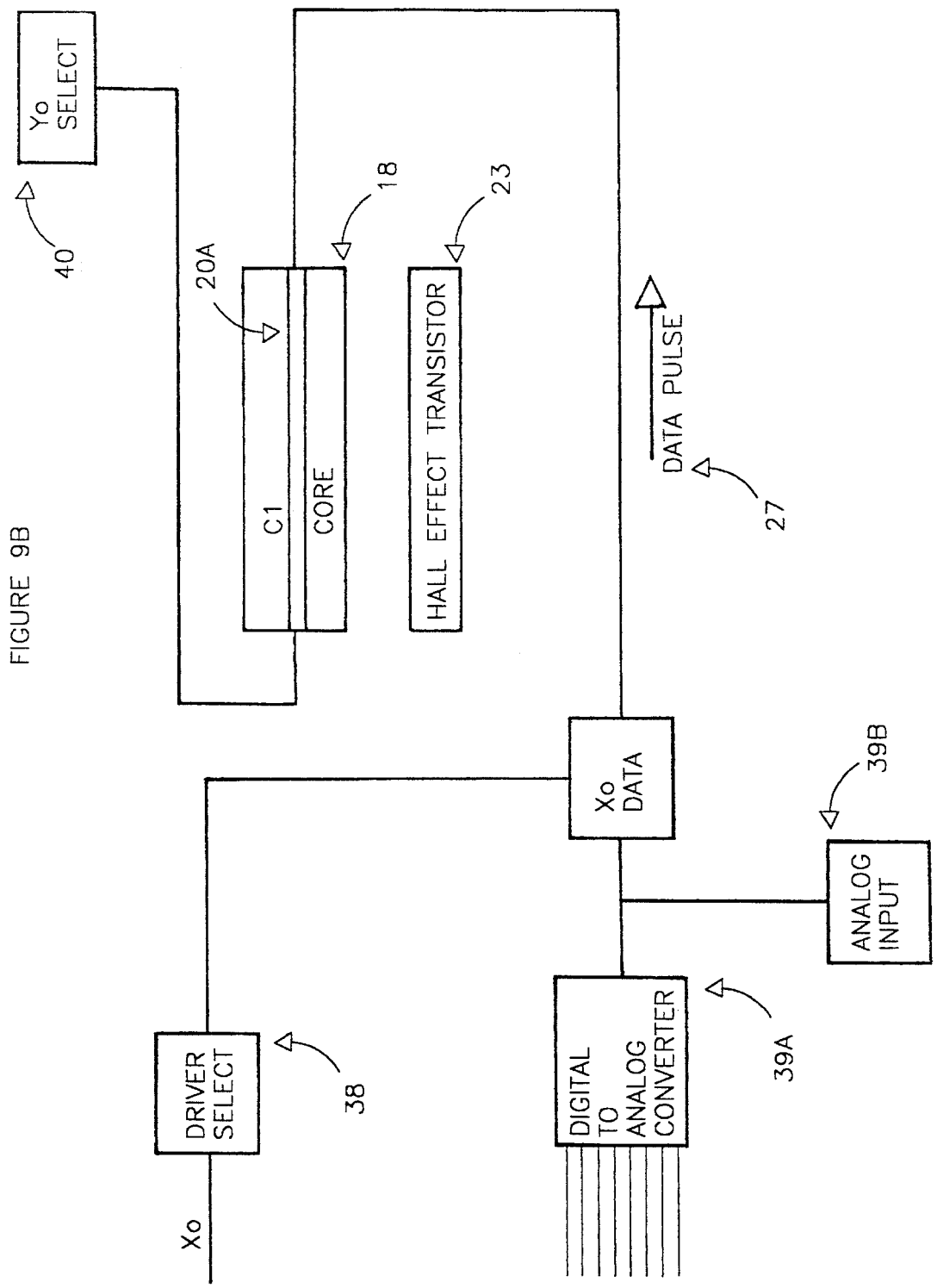

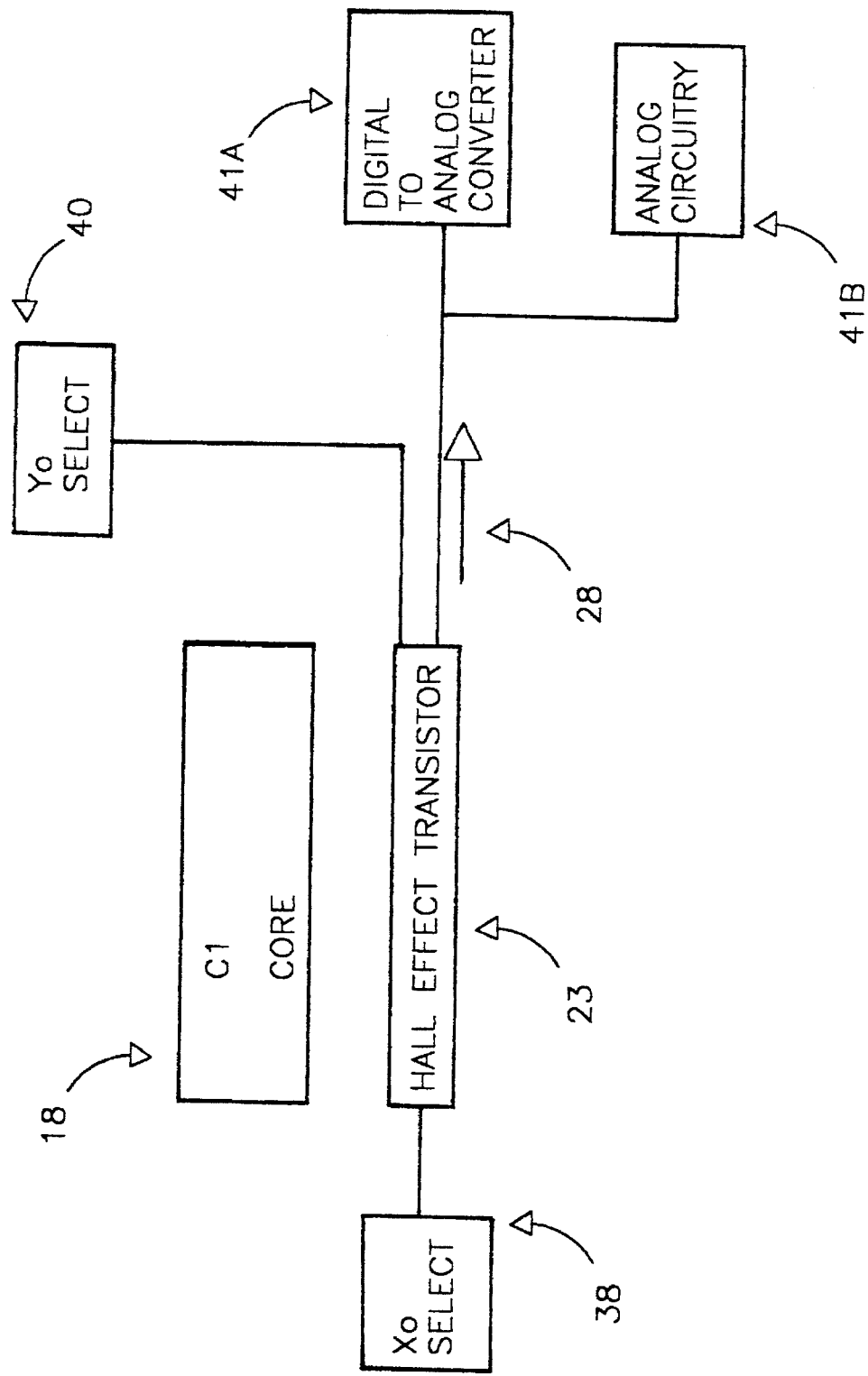

NONVOLATILE MAGNETIC ANALOG MEMORY

BACKGROUND OF THE INVENTION

1. Field of the Invention

This invention relates to the field of nonvolatile analog magnetic memories. Specifically this invention avoids the use of moving mechanical parts or moving magnetic domains or bubbles or any form of digital storage.

2. Description of the Prior Art

Man's first methods of analog data storage included counting on fingers as well as simple written representations of numbers counted. The most common current form of analog data storage is magnetic tape, where information embodied as electromagnetic signals is magnetically written onto the tape, and magnetically read when the data is later needed. The current process of writing and reading analog data on tape is slow in comparison to the current computer, microelectronic, semiconductor technology. In addition the tape nonvolatile analog format must be electromechanically written and read which allows opportunity for unreliability. The linear action of tape precludes the possibility of random accessibility. Methods of converting analog information into digital formatted data for storage of the original analog data in digital memories has been developed using analog to digital converters. Digital dynamic, digital static, and digital nonvolatile memories are used for the actual storage of analog data which has been converted to digital format. When data is retrieved from it's digital format, it is converted back to it's original analog format by a digital to analog converter. Digital random access cell arrays on substrates exist to store large amounts of information, but in all cases there are only two types of data storable in any one cell, an on signal or an off signal. This requires the inefficient use of many cells to store a piece of analog data since it is impossible to represent a unique piece of analog data as a simple on or off signal. There is no way to differentiate differing pieces of analog data. Bubble memories and all dynamic, static, and nonvolatile random access memories currently in art are all digital in nature with limited storage per cell of an on state or an off state only.

In addition to the foregoing memory systems the "Sheet Random Access Memory", U.S. Pat. No. 4,791,604 discloses a nonvolatile memory system comprising a substrate including a plurality of ferromagnetic domains and a corresponding plurality of distinguishable locations, and a fixed drive device to selectively generate an electromagnetic field within the substrate of a selected one of the distinguishable locations in order to alter the ferromagnetic domain into one of at least two distinct magnetic configurations corresponding to a 0 and a 1. This is clearly a digital device despite the use of magnetic domains and the possible use of a Hall effect device as part of the fixed sensing portion of this device.

In another example shown by Shu-Yau ET AL, "Ferroelectric Memory Device" U.S. Pat. No. 3,832,700, the abstract reads; A ferroelectric memory device utilizing the remanent polarization of a thin ferroelectric film to control the surface conductivity of a bulk semiconductor and perform the memory function. The structure of the device is similar to a conventional MIS field effect transistor with the exception that the gate insulating layer is replaced by a thin film of active ferroelectric material comprising a reversibly polarizable dielectric exhibiting Hysteresis. This too is clearly a digital memory.

In another example shown by Prinz, "Thin Film Magnetic Memory Elements" U.S. Pat. No. 5,025,416, the summary of the invention states; The memory element also includes a means for magnetizing the closure domain in one of a first and second directions, whereby said closure domain can be magnetized in the first direction, indicating a "1" bit or the second direction, opposite the first direction, indicating a "0" bit. Another clearly digital memory.

In another example Heywang states in "Field Effect Transistor with a Ferroelectric Control Gate Layer" U.S. Pat. No. 3,426,255. The semiconductor device illustrated in FIG. 1 can therefore be switched from high conductivity of forward conductance to low conductivity or the blocked state and vice versa, each time by applying an electrostatic field whose direction is reversed relative to one previously effective and whose strength suffices to overcome the remanent polarization. Again a digital device.

In a final example Arndt in "Nondestructive Memory With Hall Effect Readout" U.S. Pat. No. 3,521,255 states; by a "permanently magnetizable material" I mean a material which may by the impression of magnetizing flux thereon, acquire a polarity of magnetization which it will retain until magnetizing flux of more than a predetermined amount, of the opposite to the original polarity is applied, at which time the polarity of magnetization may be switched, and where the switching may be repeated in the same manner . . . "thus the state of the field may indicate one or the other of the binary states and may be read out in the manner set out above. Another clearly digital device.

What is needed is a simple analog nonvolatile magnetic memory which is truly transportable which does not require the use of electromechanical parts for writing and reading, which is very easily compatible with existing electronic circuit technology and computer systems.

BRIEF SUMMARY OF THE INVENTION

The present invention is a Nonvolatile Magnetic Analog Memory comprising an analog memory cell in which a ferromagnetic core domain and a single coil or many coils adjacent to the direct current ferromagnetic core are deposited on a substrate with a write/drive means and a read/sensing means. A single memory cell or many memory cells can be incorporated into this device. Analog data is permanently stored through the use of saturation and desaturation of magnetic fields of individual ferromagnetic domains and reading back previously written analog data through the use of Hall Effect devices. A fixed drive device imbedded in the substrate selectively chooses one of the distinguishable ferromagnetic domains of the substrate and saturates the respective magnetic field by driving current through directly adjacent coil or coils. The drive device then reverses the current flow through the coil or coils desaturating the direct current ferromagnetic core domain to a point which we call the "0" point which is the first point in a linear portion, of the graphed curve of all possible saturation levels of the ferromagnetic domain, said linear portion of the graphed curve representing the saturation levels where data can safely be indefinetly stored as nonvolatile analog data. An additional increase in the current level decreases the saturation level below the "0" point to a level which is the data storage point. Since any of the individual ferromagnetic domains can be saturated and then desaturated, each domain in each cell can hold any saturation level from the "0" point to the last of the acceptable repeatable saturation levels which we call level "Z". The amount of saturable points is only limited by the stability of the magnetic characteristics of the ferromagnetic core domain. It is therefore important that each ferromagnetic core domain is as much a duplicate as possible magnetically. As an example it would be easy to assign every ASCII character a specific saturation level. Any one character could then be stored in a single NVMAM cell. Any analog value could be stored by it's related saturation level in any one NVMAM cell.

The memory further comprises a fixed sensing device embedded in the substrate for selectively reading the indefinetly stored analog data described above. This is accomplished by means of a Hall Effect Device which measures the electromagnetic field strength saturation level of the ferromagnetic domain of the cell it is in. Each cell has it's own Hall effect device. In this way a true Nonvolatile Magnostrictive Analog Memory is provided.

In one embodiment the device is a single cell holding data. In a second embodiment the device is a plurality of distinguishable cells with a drive and write means to selectively choose a specific location of the plurality of distinguishable cells for writing, and a sensing and reading means to choose a specific location of the plurality of distinguishable cells for reading stored analog data. In a third embodiment digital data is converted to analog data and written and read as indicated above. Analog data can be converted back to digital data as is needed. In another embodiment the substrate can be laminated or deposited directly on a rotating disk and the writing/drive and reading/sensing means can be attached to a floating electromechanical head which physically moves the write and read means to the specific distinguishable ferromagnetic domain locations being written or read from.

The above and other objects, features, advantages, and embodiments of the present invention can best be understood by first reviewing the following drawings and the detailed description.

BRIEF DESCRIPTION OF THE DRAWINGS

FIG. 9B is a schematic view of the desaturation of the direct current magnetic ferrite core, writing data onto said core.

FIG. 10 is a schematic view of the read cycle of a plurality of cells of the type shown in FIGS. 5.

DETAILED DESCRIPTION OF THE INVENTION

This invention is known as a Nonvolatile Magnostrictive Analog Memory or NVMAM. The NVMAM is a true analog memory which in a first embodiment can be characterized as a single ferromagnetic core domain on a substrate incorporating a write/drive and a read/sensing means which together is a single memory cell. In a second embodiment it can be characterized as an organized group of memory cells similar in the cell's location and organization to an analog embodiment of a single or multi-cell digital dynamic random access memory. In another embodiment the present invention can be characterized as an analog version of digital hard drive and floppy drive memory storage devices. In another embodiment the device can convert digital data to analog format and save it in the analog NVMAM. Later it can read the previously stored analog data from the NVMAM and convert it back to digital data. Conventional photolithographic and integrated circuit manufacturing techniques as well as, and in combination with standard hard drive and floppy drive manufacturing techniques can be used to fabricate this invention in it's many embodiments.

The NVMAM in it's simplest description is a domain of ferromagnetic core material deposited on a substrate which also incorporates a specifically placed Hall Effect Device. A magnetized ferromagnetic domain functions like a ferromagnetic core and if magnetized will retain it's magnetized value until it is purposefully destroyed. The magnetic field saturation level of the ferromagnetic core domain is used in this invention as the means of nonvolatile analog storage. The ferromagnetic domain is first magnetized to it's complete saturation level and subsequently desaturated to a level which is called the zero point as it is the first of many saturation levels of all possible saturation levels of the ferromagnetic domain which occur in a stable repeatable linear fashion which is representable on a graph of all saturation levels as the linear portion of the graph. The linear portion of the graphed curve is a range of storable saturation levels which are the specific result of specific analog electronic signals driven into the device. The last acceptable saturation level for data storage is called the "Z" point.

Figure 1:
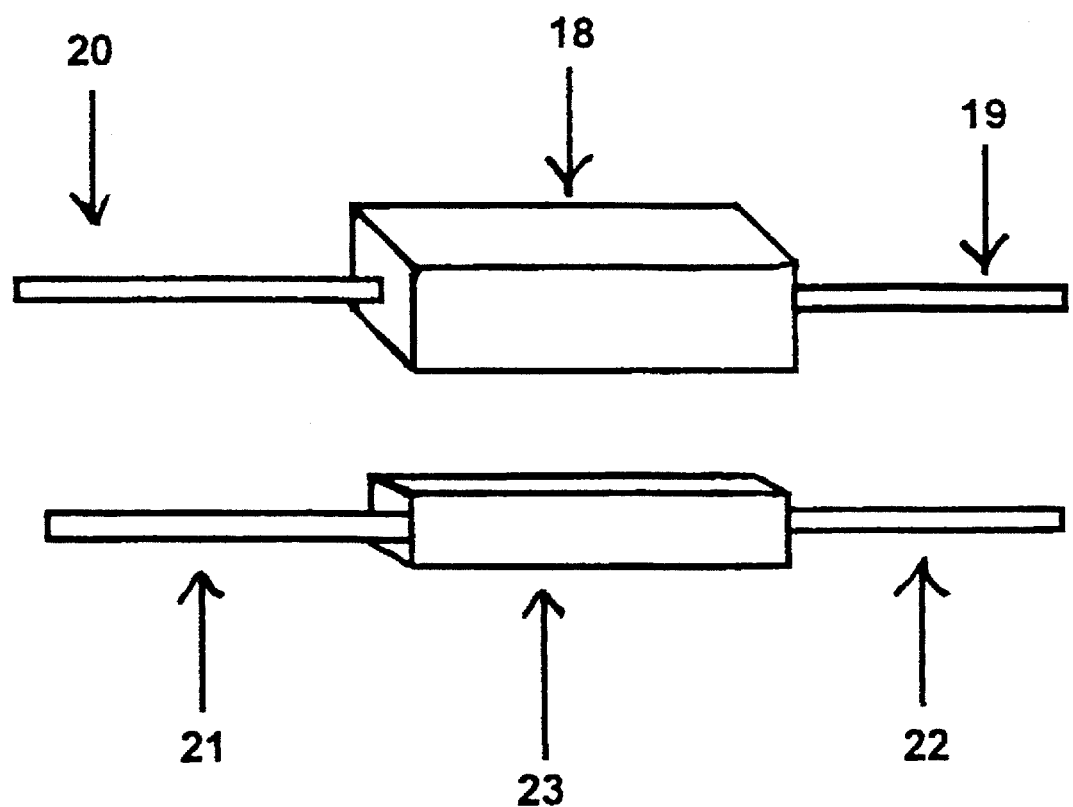
FIG. 1 and its companion FIG. 1A are diagrammatic perspective views of the invention.

FIG. 1 is a diagrammatic perspective view of the invention. 18 is a direct current ferromagnetic domain also to be called henceforth a ferromagnetic core, which is magnetizable and demagnetizable, 20 is the input lead of a coil 20A passing through and adjacent to the ferromagnetic core 18, 19 is the output lead of coil 20A. 21 is the input lead of the Hall Effect Device. 22 is the output lead of the Hall Effect device. 23 is a Hall Effect Device.

Figure 1A:
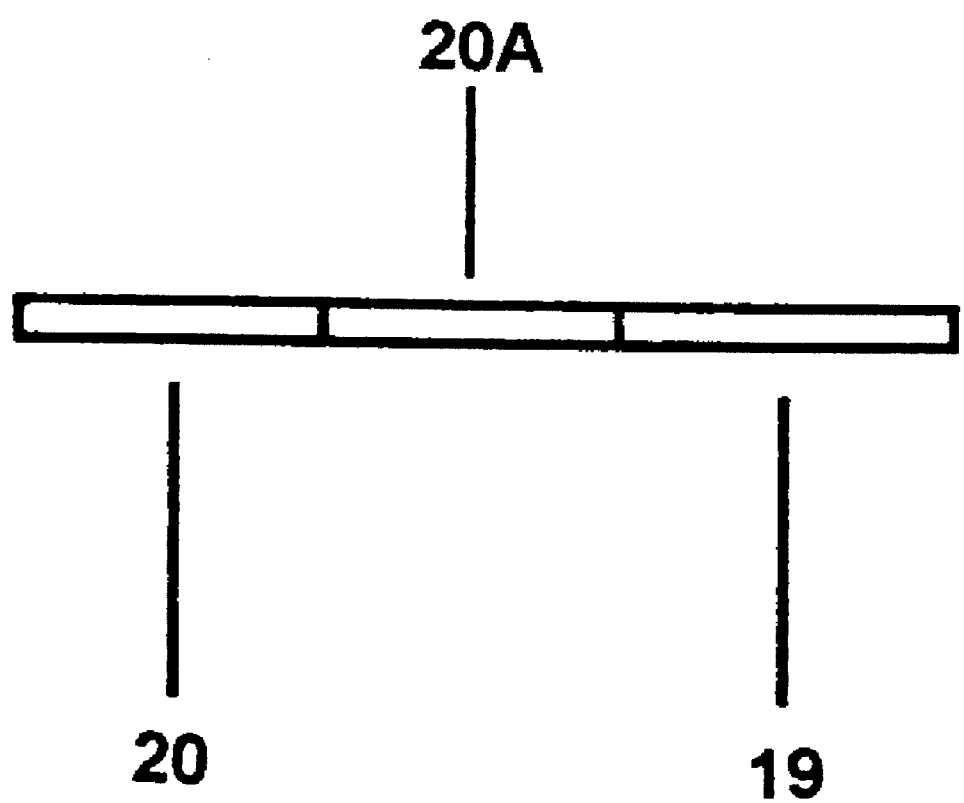

In FIG. 1A we see 20A a coil which is surrounded by ferromagnetic core 18. The distance between ferromagnetic core 18 and coil 20A is designed to allow magnetization and demagnetization of ferromagnetic core 18 by driving current through adjacent coil 20A. Many different shapes and sizes of ferromagnetic core 18 and coil 20A could be used in the invention.

Figure 2:
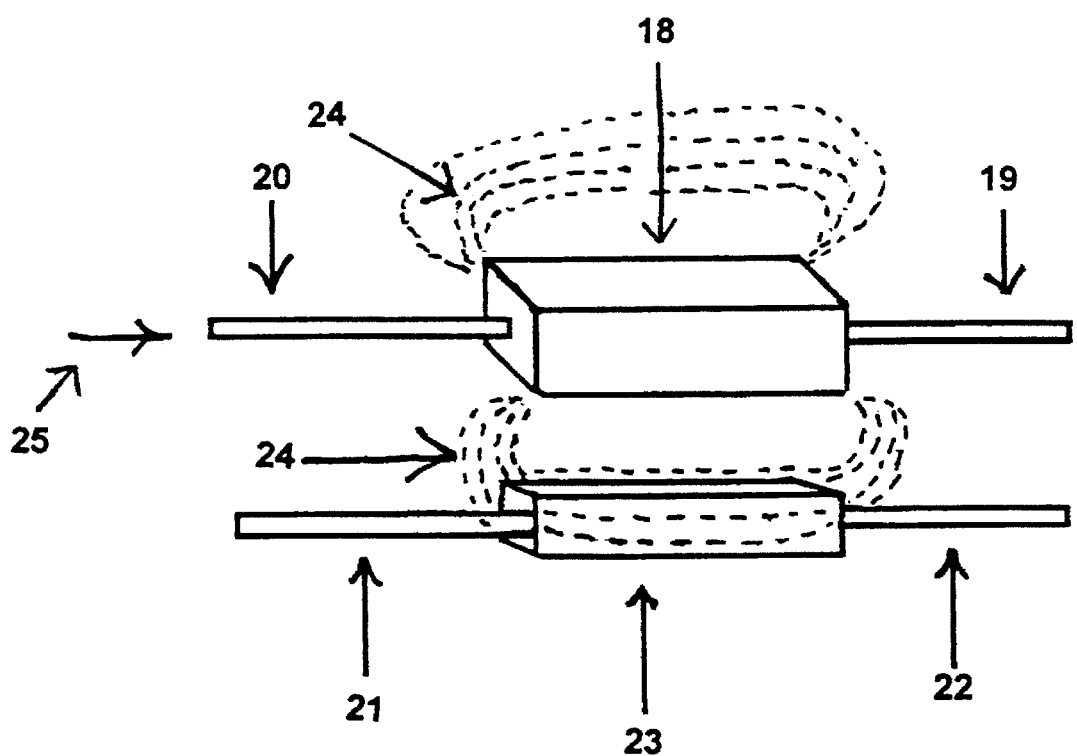
FIG. 2 is a diagrammatic sectional view of the invention which illustrates the physical principle of saturating the magnetic field of the invention in preparation of writing information into the memory.

In FIG. 2 power is driven into input lead 20 in direction 25 for the purpose of creating a magnetic field 24 of full saturation.

Figure 3:
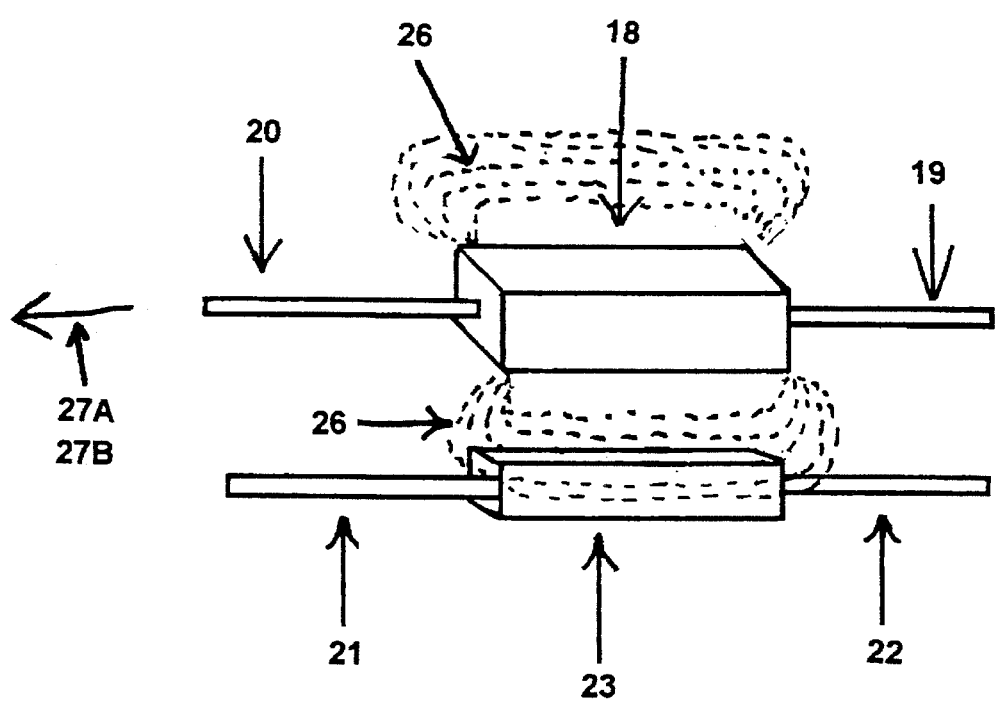
FIG. 3 is a diagrammatic sectional view of the invention which illustrates the physical principle of demagnetizing the magnetic field of the invention to write information into the memory.

In FIG. 3 the direction of the current 27A flowing past ferromagnetic core 18 is reversed causing a reduction of the saturation level of the magnetic field 26 to a level directly related to the current flow and representing the first starting point of storable saturation levels which is known as the "0" point. An additional desaturation current 27B driven into the device cumulatively with the "0" point current flow 27A reduces the saturation level of the magnetic field to permanent nonvolatile analog data storage field strength level directly representing the "0" point desaturation current plus the data desaturation current. Data has been written into the invention.

Figure 4:
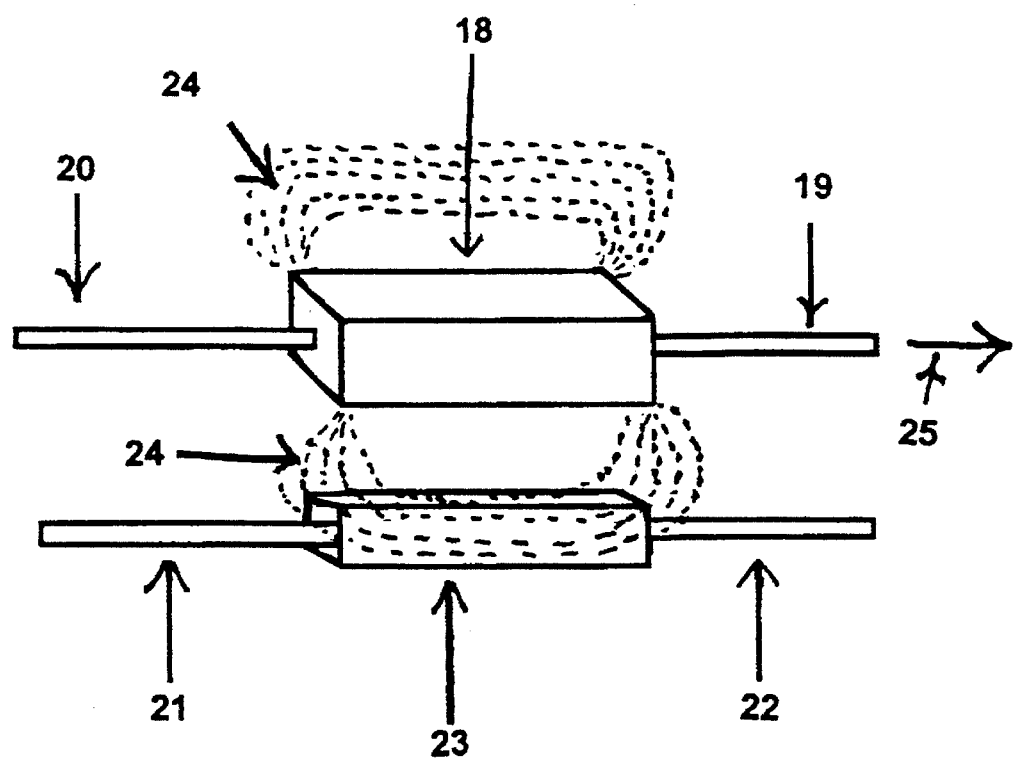
FIG. 4 is a diagrammatic sectional view of the invention which illustrates the physical principle of saturating the magnetic field to erase information from the memory.

FIG. 4 again represents the invention wherein the ferromagnetic core 18's magnetic field 24 is fully saturated. The purpose now is to erase the previously stored data of FIG. 3. Any stored data or "0" point can be permanently destroyed by fully saturating magnetic field 24 of the device.

Figure 5:
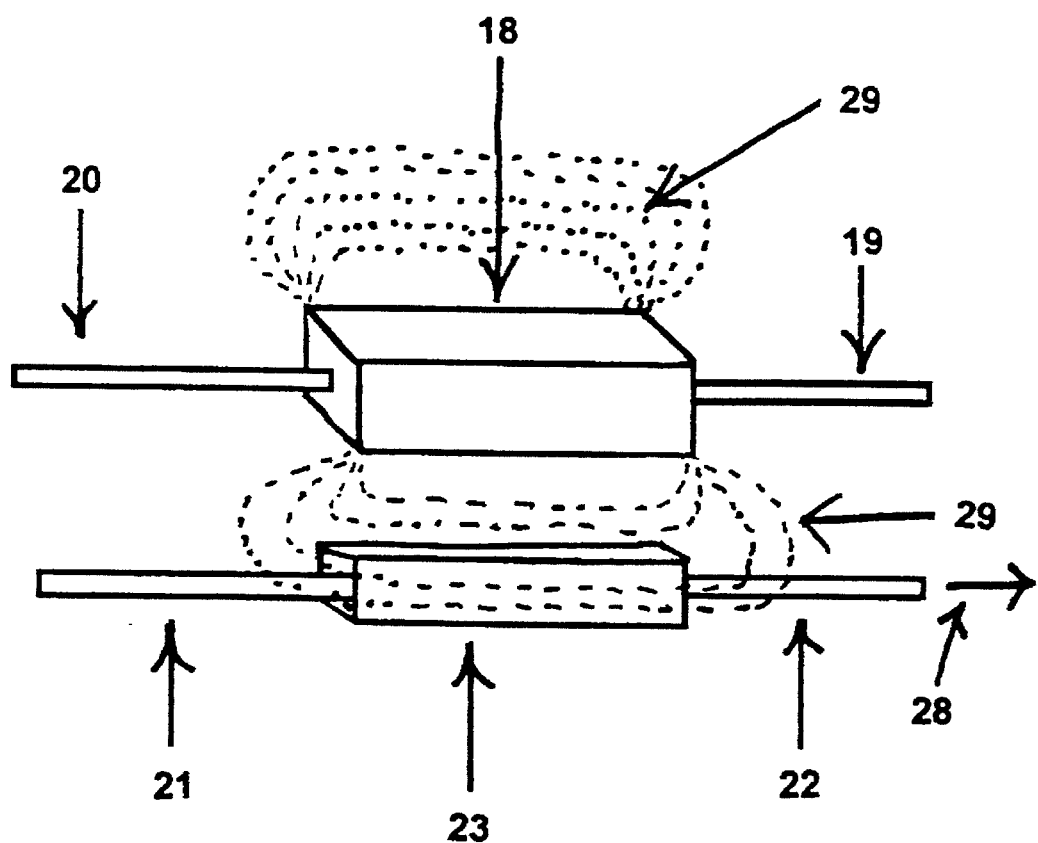
FIG. 5 is a diagrammatic sectional view of the invention which illustrates the physical principle of reading information from the memory using a Hall Effect Semiconductor Device.

Turning now to FIG. 5 we see an illustration of the physical principle of reading data stored in the device. Magnetic field 29 can be any value which represents stored data or the "0" point or the "Z" point. Hall Effect device 23 is in place adjacent to direct current ferromagnetic core 18. Magnetic field 29 representing permanently stored analog data overlaps the purposefully placed Hall Effect device 23. Hall Effect device 23 is effected by magnetic field 29 causing an output of current flow 28 in output lead 22 of the Hall Effect device 23. Output current flow 28 is directly related to magnetic field strength 29. The maximum saturation level of field strength 29 would be read by Hall Effect device 23 as "no data stored". A field strength 29 of "0" point level would be read as a "last point of no data stored". Any decreased field strength 29 would be read by the Hall Effect device 23 as stored data, down to the minimum saturation level in which data can be effectively and permanently stored which is called the "Z" point.

Figure 6:
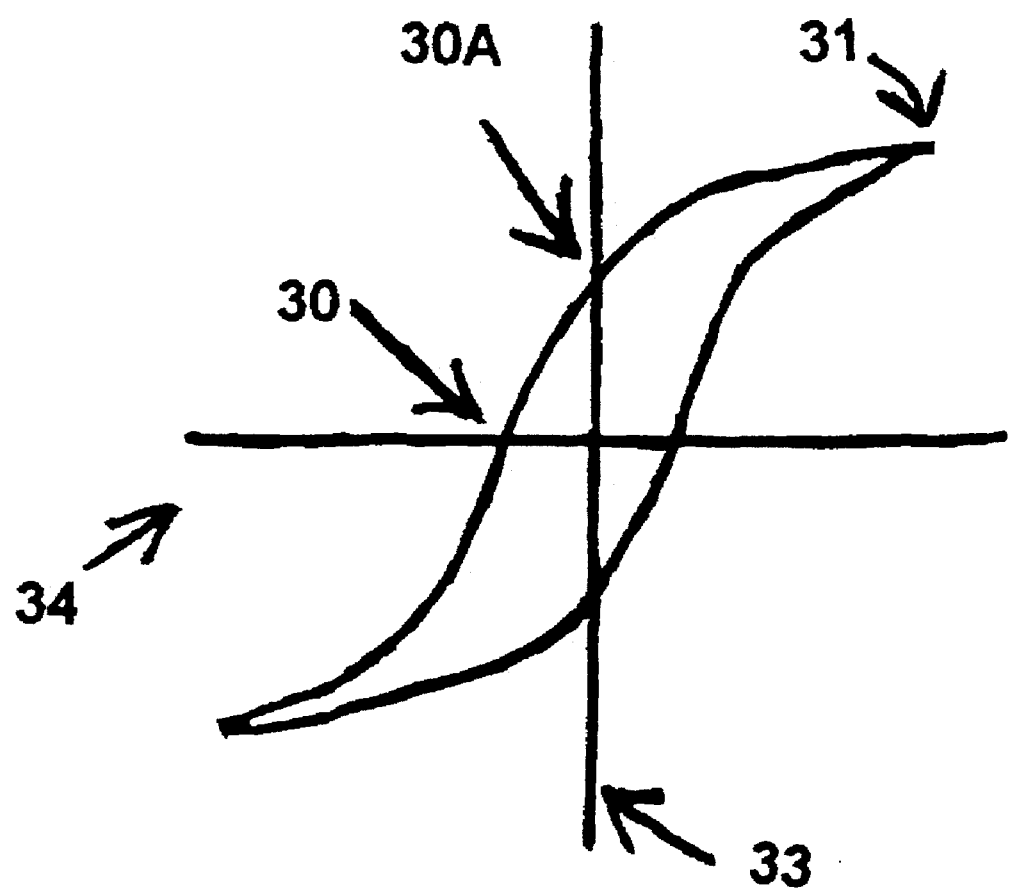
FIG. 6 is a graph showing the B-H Hysteresis curve of the invention's direct current magnetic core field strength at maximum saturation.

Turning now to FIG. 6 we see the B-H Hysteresis curve, a representation of the total possible field strength levels of direct current ferromagnetic core 18 of FIG. 1. 31 is the point of maximum magnetic field saturation of direct current ferromagnetic core 18. 30A is a point on the Hysteresis curve where the eminent field strength results from the decrease to zero of the saturating current flowing through coil 20A adjacent to direct current ferromagnetic core 18. 30 is the point on the Hysteresis curve that represents the "0" field strength caused by reversing the directional current flow used to establish the maximum field strength level 31. 33 represent's the Y axis, the direct current ferromagnetic core 18's field strength levels. 34 represents the X axis, current level and direction of flow, applied into a coil 20A which is adjacent to a direct current ferromagnetic core 18.

Figure 7:
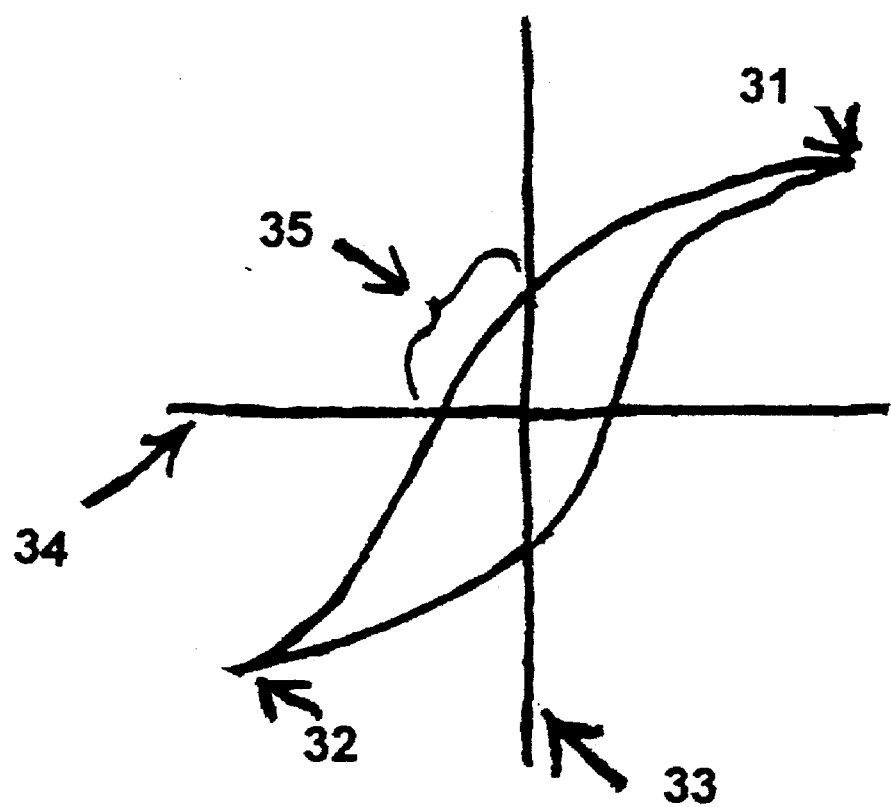
FIG. 7 is a graph showing the B-H Hysteresis curve of FIG. 6 and the linear portion, of the decreasing field strength portion, of said curve.

In FIG. 7 we see 35 the linear portion of the part of the B-H Hysteresis which is decreasing in field strength between 30A and 30 due to reverse current flow applied as described previously with regard to FIG. 3. The reverse current flow desaturates the direct current ferrite magnetic core domain.

Figure 8:
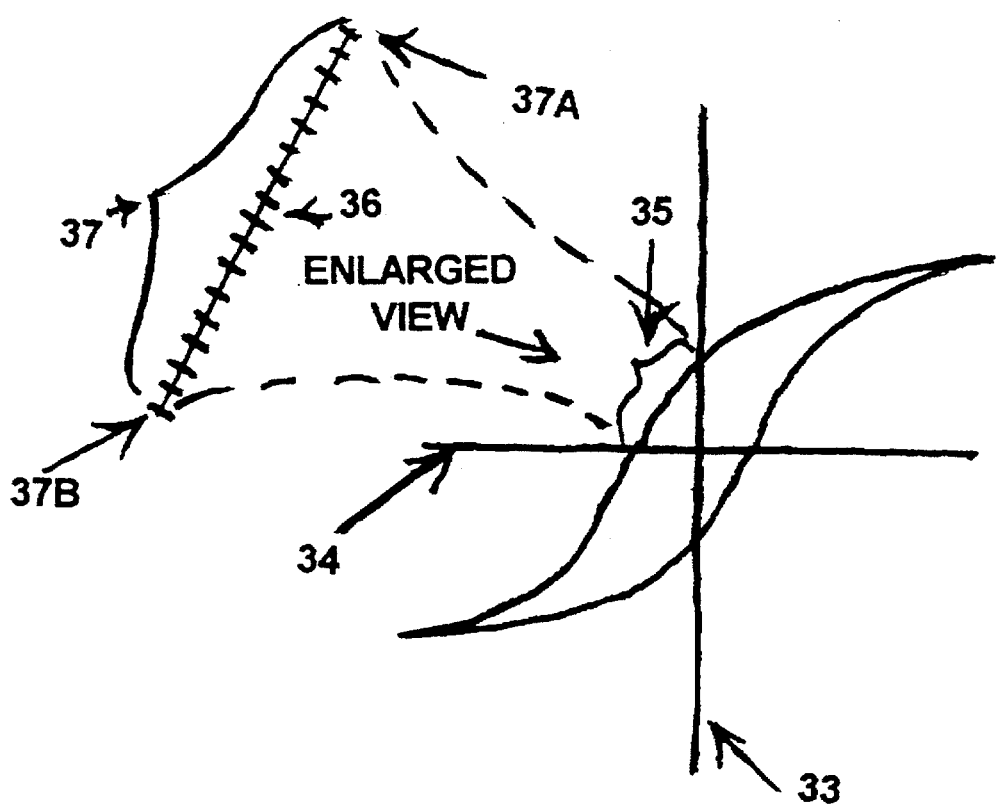
FIG. 8 is a graph showing the B-H Hysteresis curve of the invention's direct current magnetic core's field strength after demagnetization indicating relative levels of field strength on the linear part of the curve which are acceptable for use as stable stored information.

Turning to FIG. 8 we see an enlarged view of 35. 36 represents the most linear sequential grouping of 37 all possible decreasing field strengths of 18 direct current ferromagnetic core domain. 37A is the "0" point, the first acceptable field strength level for data storage in this linear sequential grouping 36 of 37 all possible decreasing field strengths. 37A is never used for data storage, but solely as a marker that data storage can begin at the next lower field strength level. 37B is the "Z" point, last acceptable field strength level usable for data storage of 36 the linear portion of 32 all possible decreasing field strengths. 37 in toto represents a plurality of all possible decreasing field strengths usable for data storage of 36 the linear portion of 37. The quantity of possible field strength levels represented by 37 is unlimited. It could have some practical limitation due to sensitivity of Hall Effect devices, or current flow controls, but theoretically the volume of data storage levels remains unlimited.

Figure 9A:
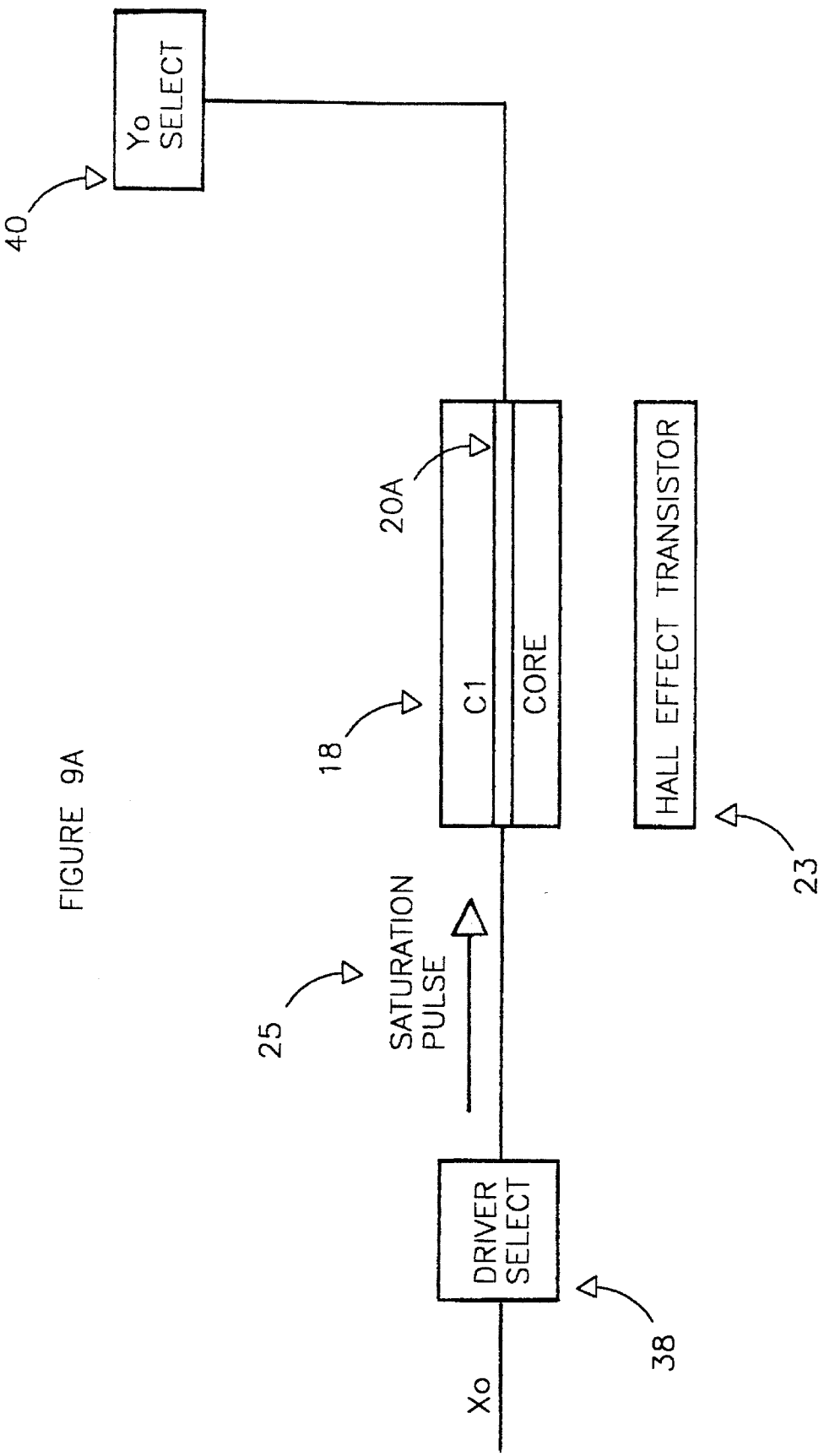
FIG. 9A is a schematic view of the saturation of the direct current magnetic ferrite core at the beginning of the write cycle.

Turning to FIG. 9A we see a schematic view of the saturation of direct current ferromagnetic core 18. Xo driver select circuit 38 chooses coil 20A and direct current ferromagnetic core 18 (c1) with Yo select 40. Saturation pulse 25 is driven through coil 20A saturating the core and creating magnetic field 24 of FIG. 2 and FIG. 4.

FIG. 9B is a schematic view of the desaturation of direct current ferromagnetic core 18 (c1). Xo driver select 38 and Yo select circuit 40 choose to reverse current flow to direction 27 which is opposite the current flow direction used to saturate in FIG. 9A direction 25. Digital to analog converter 39A can convert digital data to analog format. Current from 39A or analog input 39B is added to the desaturating current 27 causing it to be desaturating data current flowing through coil 20A, which permanently stores the analog data as the magnetic field strength of desaturated direct current ferromagnetic core 18(c1).

FIG. 10 is a schematic view of the read cycle of a cell diagrammatically shown in FIG. 5. Xo select 38 and Yo select 40 choose Hall Effect transistor 23 which senses the magnetic field of direct current ferromagnetic core 18(c1) as shown in FIG. 5. Current output flow 28 is created by Hall Effect transistor 23 and flows to Analog to digital converter 41A for conversion to a digital signal or flows directly as analog data to additional analog circuitry 41B.

Figure 11:
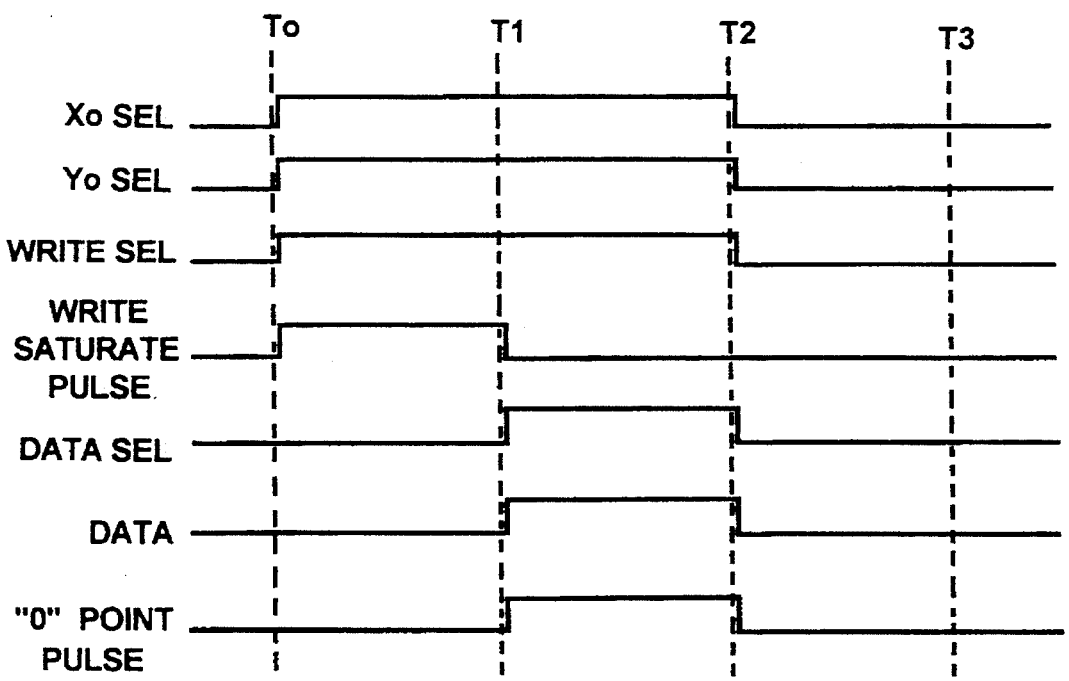
FIG. 11 is a timing diagram of the circuit described in connection with FIGS. 2 and 3 and 4 and 9.

In FIG. 11 we see a timing diagram associated with the write circuit described in FIGS. 2, 3, 4, 9A/B. At time TO; Xo Sel, Yo Sel, write Sel, turn on along with write saturate pulse. At time T1; write saturate pulse turns off as data sel, data, and "0" point pulse turn on then desaturating the device until data is stored at it's related magnetic field strength. At time T2 Xo sel, Yo sel, write sel, data sel, data, and "0" point pulse turn off as the write cycle is completed.

Figure 12:
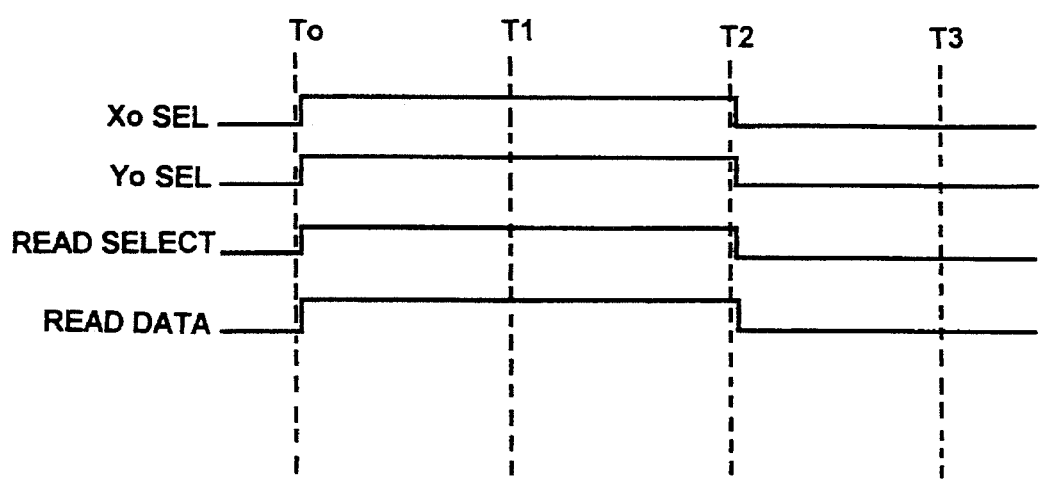
FIG. 12 is a timing diagram of the circuit described in connection with FIGS. 5 and 10.

In FIG. 12 we see a timing diagram associated with the read circuits described in FIGS. 5 and 10. At Time TO the Xo sel, Yo sel, Read sel, and Read Data turn on. The Hall Effect device 23 of FIGS. 5 and 9A/B turns on and reads the magnetic field strength 29 of direct current ferrite core 18 of FIG. 5. The data is transmitted out of the Hall Effect device down the circuit and at time T2 the Xo, Yo, Read sel, and Read Data, all turn off.

Figure 13:
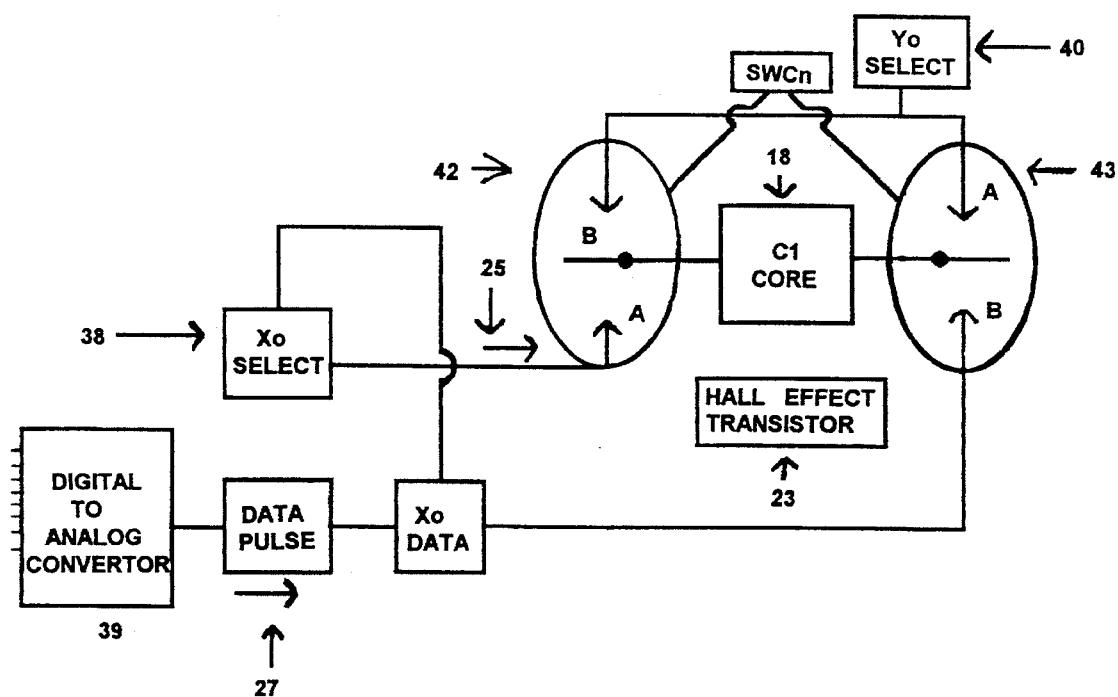
FIG. 13 is a schematic view of a switching network to control opposite current flow directions incorporating the embodiment of FIG. 9A and 9B.

FIG. 13 is a schematic view of a switching network to control opposite current flow directions incorporating the embodiment of FIGS. 9A and 9B, Xo sel 38 and Yo sel 40 choose if the direct current ferromagnetic core 18 will be saturated to erase data and prepare for future data storage, or if direct current ferromagnetic core 18 will be desaturated actually saving data by creating a reduced strength magnetic field 29 of FIG. 5. Switch 42 and 43 are always in opposite states which is controlled by Switch Control Circuit SWCN. Depending on which switch 42 or 43 first receives current from X sel 38, the SWCN senses which switch is being activated and automatically flips the other switch into opposition. If in the next cycle the X sel 38 chooses for current to flow to the other switch, the SWCN circuit again senses and flips the switch not receiving current into opposition of the switch receiving current. During the saturation/preparation stage of direct current ferromagnetic core 18, current runs through switch 42A then through direct current ferromagnetic core 18 then through switch 43A to Yo sel. During the desaturation/data storage stage Xo sel sends current through Xo data picking up the data pulse and then runs through switch 43B into and through direct current ferromagnetic core 18 into switch 42B and out Yo sel. Note that the current is running in an opposite direction through direct current ferromagnetic core 18 when storing data as opposed to preparing the direct current ferromagnetic core 18 for future data storage.

Figure 14A:
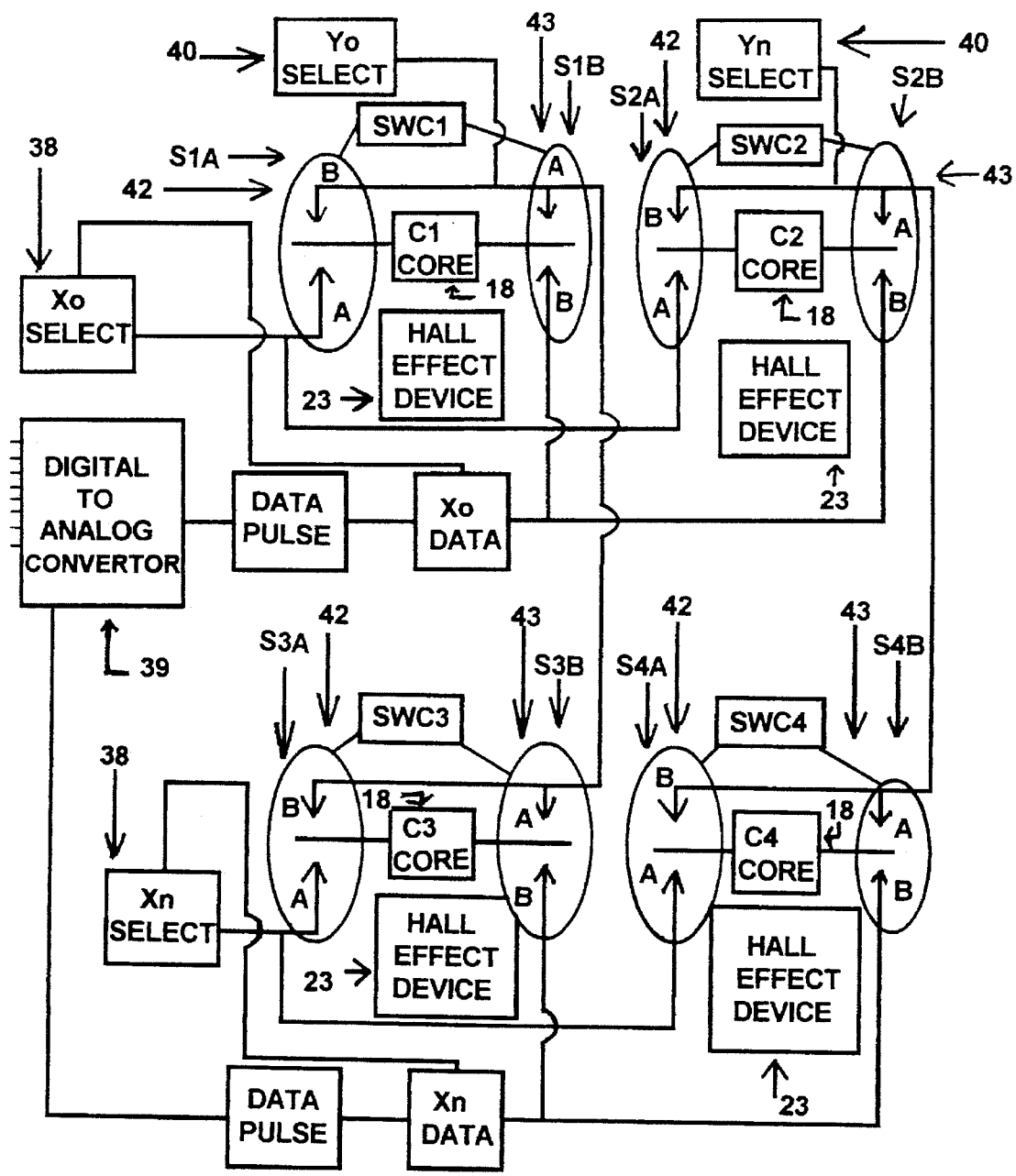
FIG. 14A is a schematic view of the write cycle of a random access memory incorporating the embodiment of FIGS. 1 through 13.

FIG. 14 A is a schematic view of the write cycle of a nonvolatile magnostrictive analog random access memory constructed of multiple memory cells, each incorporating the embodiments of FIGS. 1 through 13. Multiple memory cells are connected to form the random accessibility of this memory. Xsel 38 and Ysel 40 choose the specific cell 18 of the plurality of all possible cells to be specifically written to. Saturation and desaturation for any specific cell chosen of the plurality of all possible cells functions exactly as described above in FIGS. 9A, 9B, and 13. The quantity of cells in a random access memory is limited strictly by the size of the substrate material the cells are built upon.

Figure 14B:
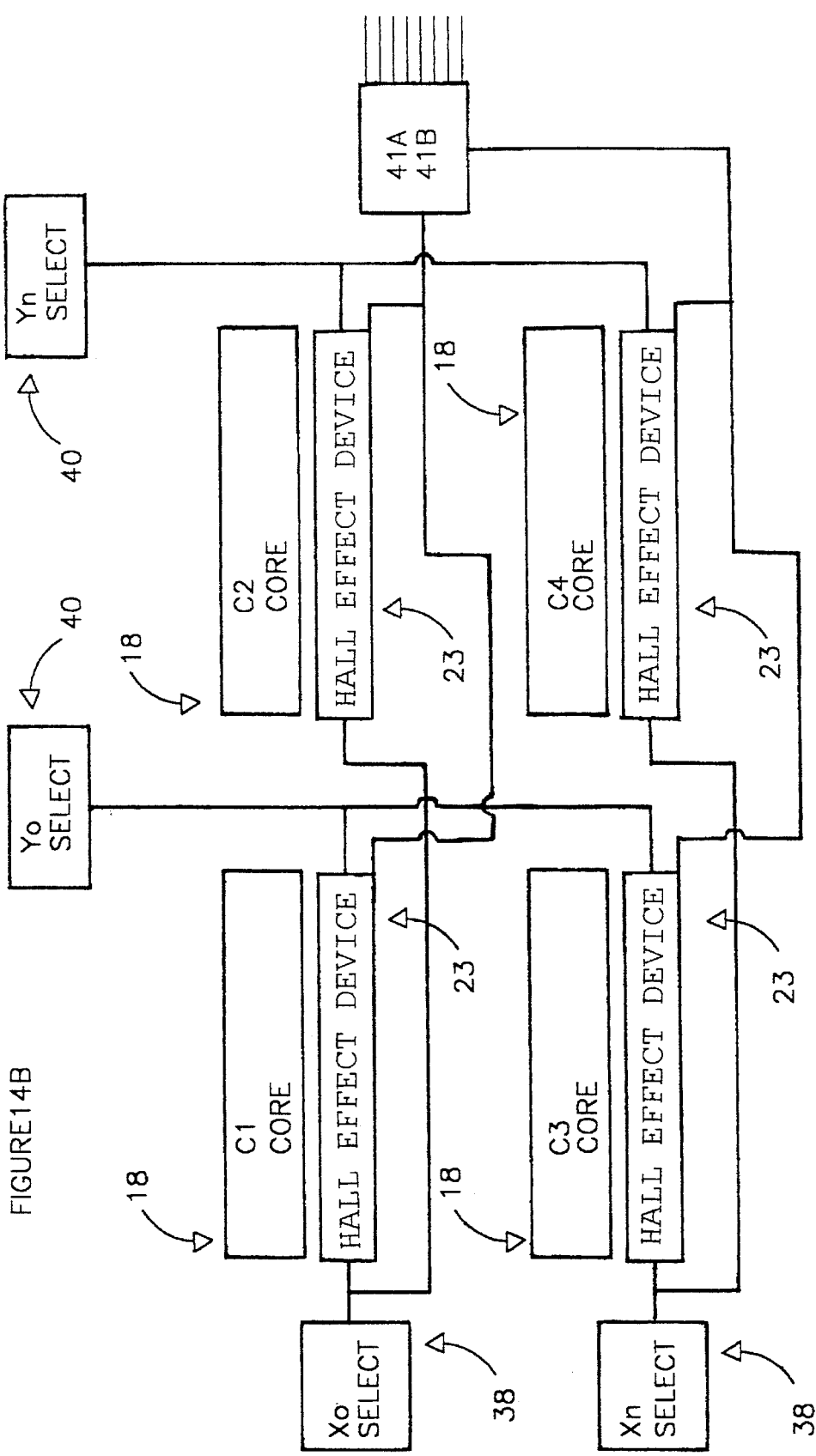
FIG. 14B is a schematic view of the read cycle of a random access memory incorporating the embodiments of FIGS. 1 through 13.

FIG. 14B is a schematic view of the read cycle of nonvolatile magnostrictive analog random access memory constructed of multiple memory cells each incorporating the embodiments of FIGS. of FIGS. 1 through 13. Multiple memory cells are connected to form the random accessibility of this memory. Xsel 38 and Ysel 40 choose the specific cell 18 of the plurality of all possible cells for reading. Hall Effect Device 23 of the chosen cell is activated and senses the data which is stored as the field strength of the magnetic field of the chosen cell 18. The data is converted from magnetic field strength to an analog signal by the Hall Effect Device 23 and flows through the circuitry to the analog to digital converter 41A or other analog circuitry 41B which uses the data as needed.

Figure 15A:
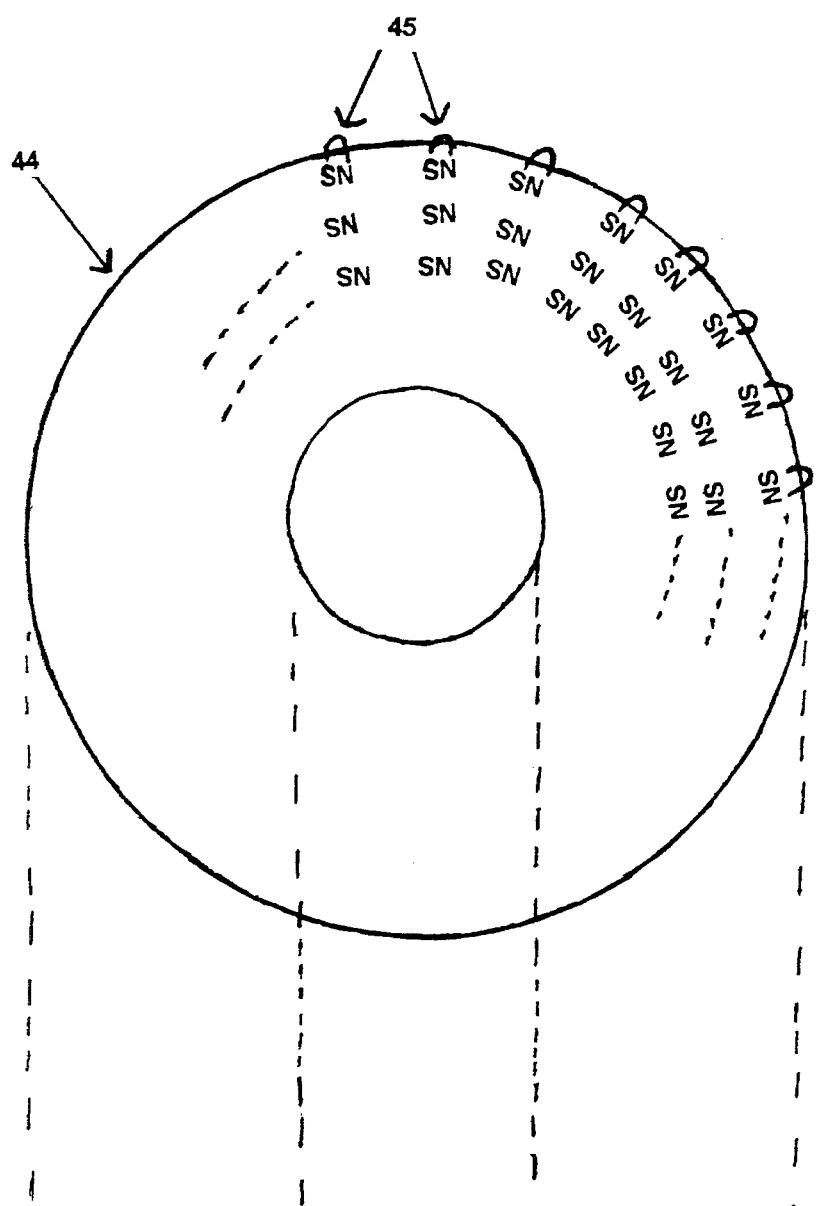
FIG. 15A is a diagrammatic top view of a second embodiment of the invention incorporating the invention into current magnetic media hard or floppy disk drive data storage technology.

FIG. 15A is a diagrammatic top view of a second embodiment of the invention incorporating the invention into current magnetic media floppy and hard disk drive data storage technology allowing the storage of analog data in an analog format. Currently hard and floppy disk drives only store data in a digital format. FIG. 15A is a top view of a floppy or hard disk drive magnetic media. Current technology assigns location addresses to domains on the magnetic media. The magnetic field is then placed into one of two states representing either an on or an off bit of data. Currently no other possibility exists for each domain or cell. In FIG. 15A Cells 45 are discrete magnetic domains at specific location addresses on magnetic media 44. Each cell is polarized in the same direction strictly for the purpose of identifying the domain 45 as a discrete cell.

Figure 15B:
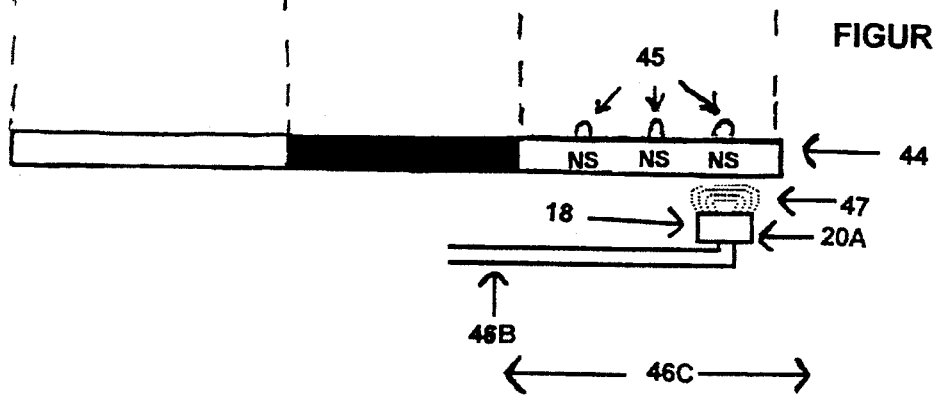
FIG. 15B is a diagrammatic side view of FIG. 15A.

FIG. 15B shows a diagrammatic side view of the second embodiment of the invention. Magnetic media 44 in operation would rotate like floppy and hard disk drive technology. Coil 20A and direct current ferromagnetic core 18 and Hall Effect Device 53 floating on arm 46B, moves in the directions indicated by 46C allowing direct current ferromagnetic core 18 and Hall effect device 53 to have access to each and every cell 45 in order to be in position to saturate, desaturate, or sense each cell 45.

Figure 15C:
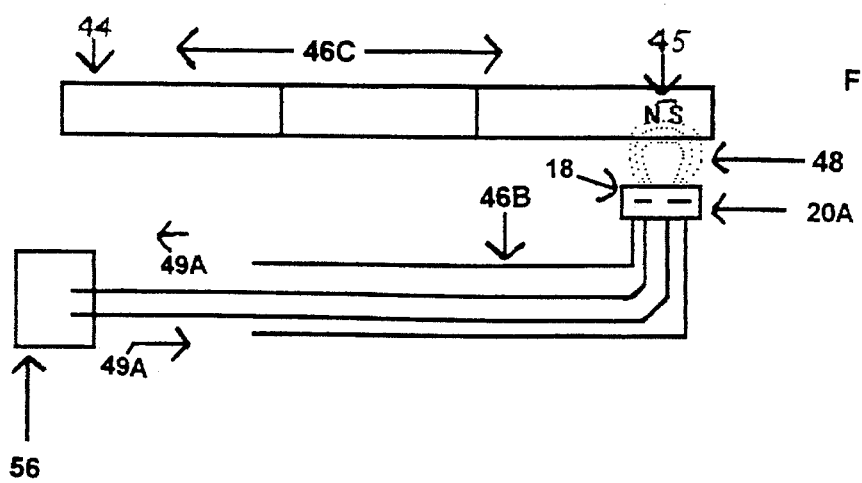
FIG. 15C is a diagrammatic side view of FIG. 15A showing magnetic saturation of a specific cell by a magnetic flying head, in preparation of writing data, which simultaneously to saturating a cell, erases any data stored in said cell incidently.

FIG. 15C diagrammatically shows the magnetic saturation of a specific cell 45 of the plurality of all possible cells 45. Coil 20A and direct current ferromagnetic core 18 on floating arm 46B moves to the correct cell location to be saturated. Direct current moving in direction 49A flows through coil 20A and direct current ferromagnetic core 18 creating a magnetic field 48 emanating from direct current ferromagnetic core 18. Direct current ferromagnetic core 18 is in such proximity to cell 45 that the magnetic field 48 created by core 18 encompasses cell 45 and creates a magnetic field 52(of FIG. 15E) in the magnetic material of cell 45. The saturation level current, in direction 49A creates a saturating field 48 which transfers to cell 45 a saturation field. Circuitry 56 is the drive and control circuitry for saturating the direct current ferromagnetic core 18 and cell 45.

Figure 15D:
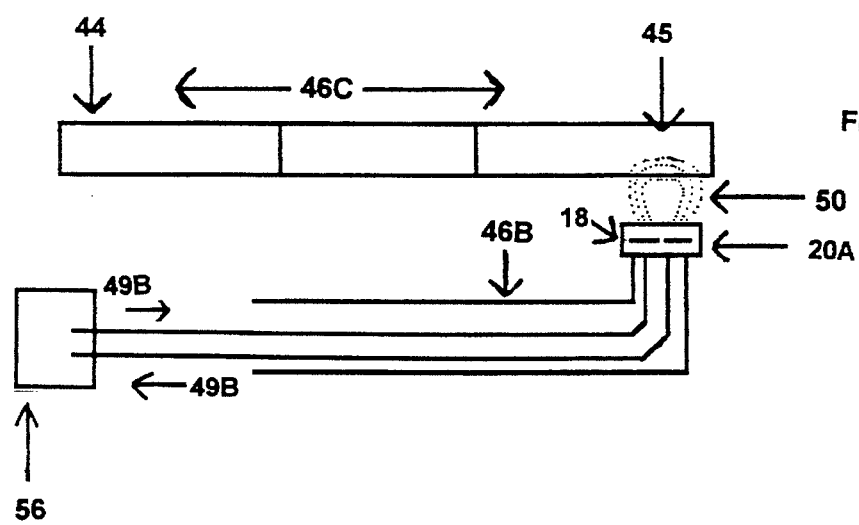
FIG. 15D is a diagrammatic side view of FIG. 15A showing the desaturation of the magnetic field of a specific cell by reversing the current flow direction from that causing saturation in FIG. 15C, specifically to write data into said specific cell.

FIG. 15D is a diagrammatic side view of FIG. 15A showing the desaturation of a specific cell 45 of the plurality of all possible cells 45. To desaturate a cell 45 the current flow 49A of FIG. 15C is reversed in FIG. 15D to direction 49B. Control circuitry 56 transmits enough current into coil 20A and core 18 to reduce the field strength of the magnetic field 48 (of FIG. 15C) to a "0" point level and then additional data current is transmitted by control circuitry 56 reducing the magnetic field of direct current ferromagnetic core 18 to a "data" magnetic field strength 50, to store data. This reduction of the magnetic field 50 of direct current ferromagnetic core 18 to a data storage level, directly affects cell 45 in proximity to direct current ferromagnetic core 18, and the field strength of cell 45 is also reduced to a field strength directly related to the field strength of direct current ferromagnetic core 18. Analog data has permanently been stored in cell 45.

Figure 15E:
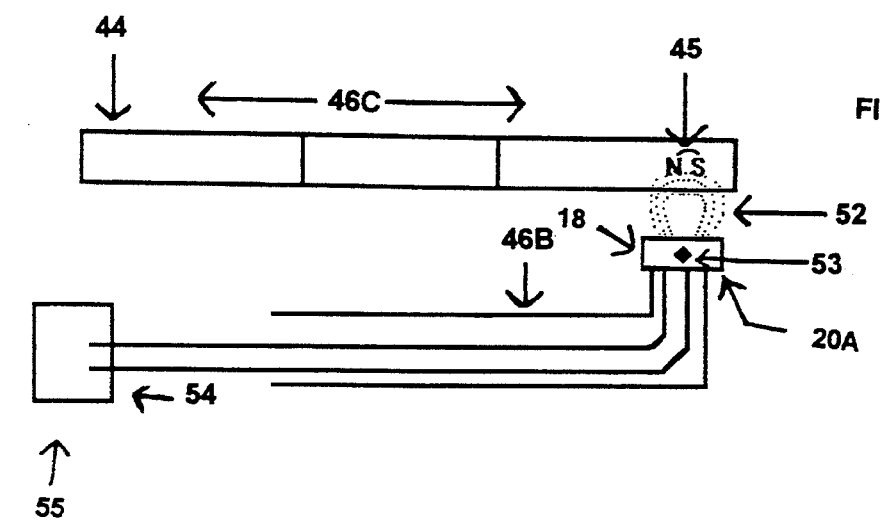
FIG. 15E is a diagrammatic side view of FIG. 15A showing the reading of stored analog data as a magnetic field of specific cell by a hall effect transistor or other magnetic sensing device on a flying head.

FIG. 15E shows the reading of analog data of a specific cell 45 of the plurality of all possible cells 45. Hall Effect Device 53, attached to floating arm 46B moves to a specific cell location as directed by read control circuitry 55 and senses magnetic field 52 of cell 45 and transmits the signal the Hall Effect Device 53 senses, in direction 54 to the control circuitry. The data has been read since each analog signal which is converted to a magnetic field strength can then be converted back from a magnetic field strength to an analog electronic signal.

Figure 16:
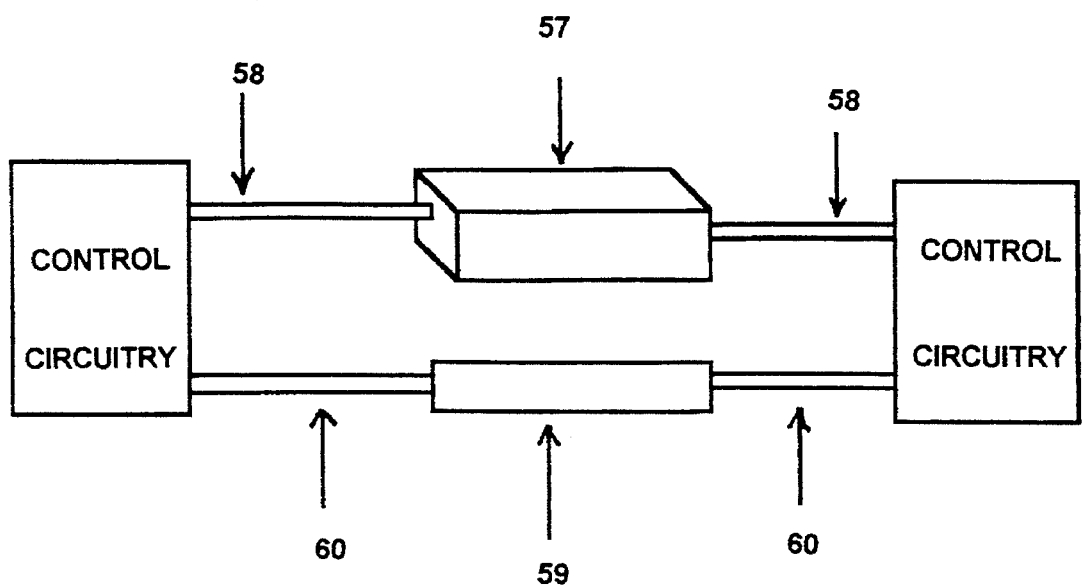
FIG. 16 is a diagrammatic view of a third embodiment of the invention incorporating superconductive ferromagnetic material.

FIG. 16 is a diagrammatic view of a third embodiment of the invention incorporating superconductive ferrocerramic magnetic and non magnetic materials into the invention as embodied in FIGS. 1 through 14B. All write and read support circuitry can be superconductive. The only requirement is that the core 57 must be able to create and hold a magnetic field adjustable to the requirements outlined in FIGS. 1 through 14B and must be readable by a Hall Effect Device. Superconductivity in this invention will increase the speed of the device, reduce the power needed to operate it considering less resistance, and should be buildable via a combination of standard Integrated circuit manufacturing process also incorporating superconductive processes where applicable.

As further examples of information or types of signals that can be stored in the magnetic core domains, virtually any type of numerical, alpha-numeric, algorithmic, or other values and signals corresponding to any possible range of magnetic field strengths capable of being impressed upon the magnetic core domains can be utilized by the present invention. Such information or signal values can be easily brought into and sent from the ferromagnetic domains of the present invention with suitable input circuits and drive circuits, and the precision of such signals only depends upon the precision and repeatability of the sensing circuit of the magnetic domains.

The invention for the purpose of clarity and example was set forth above in illustrated embodiments and written description. It must be expressly understood that many modifications may be made by those having ordinary art and skill in this field of technology without departing from the spirit and scope of the invention. The illustrated and described embodiments must not be taken as a limitation of the invention which is defined by the following claims.

We claim:

1. A non-volatile analog magnetic random access memory having an input circuit to accept analog input electrical signals and an output circuit that communicates analog output electrical signals, said magnetic memory comprising:

(a) a substrate including a plurality of separate magnetically saturable and desaturable magnetic domains at a corresponding plurality of distinguishable fixed locations;

(b) a bi-directional drive circuit configured to selectively saturate at least one of said magnetic domains using a first memory select circuit capable of randomly accessing said at least one magnetic domain, said drive circuit causing current to flow in a first direction at a magnitude sufficient to cause said saturation;

(c) said bi-directional drive circuit being further configured to selectively partially desaturate said at least one magnetic domain using said first memory select circuit, said drive circuit causing current to flow in a second direction having a direction opposite that of said first direction at a magnitude sufficient to lower the magnetic flux density of a selected of said at least one magnetic domain to an initial condition within a range of magnetic flux density levels between a zero-scale point and a full-scale point;

(d) said bi-directional drive circuit being further configured to selectively further desaturate said at least one magnetic domain using said first memory select circuit, said drive circuit causing current to flow in said second direction at a magnitude sufficient to lower the magnetic flux of a selected of said at least one magnetic domain to a level within said range, said level corresponding to the magnitude of an analog input electrical signal received from said input circuit; and (e) a plurality of sensors that each respond to the magnitude of magnetic flux, each said sensor being spaced apart from one of said plurality of magnetic domains, each said sensor being randomly accessible by a second memory select circuit, the selected said sensor producing an output electrical signal having a magnitude that corresponds to the level of magnetic flux of its respective magnetic domain.

2. The memory as recited in claim 1, wherein at least one of said sensors includes an analog-to-digital converter that outputs as said output electrical signal a digital signal having a binary numerical value.

3. The memory as recited in claim 1, wherein said input circuit includes a digital-to-analog converter that outputs an analog signal for storage in a selected magnetic domain of said plurality of magnetic domains.

4. A non-volatile analog magnetic storage media having an input circuit to accept analog input electrical signals and an output circuit that communicates analog output electrical signals, said magnetic storage media comprising:

(a) a rotatable substrate including a plurality of separate magnetically saturable and desaturable magnetic domains at a corresponding plurality of distinguishable fixed locations;

(b) a read/write head spaced apart from said rotatable substrate and configured to selectively saturate at least one of said magnetic domains using a memory select circuit capable of positioning said head to access said at least one magnetic domain, and a bi-directional drive circuit configured to cause current to flow in a first direction through said head at a magnitude sufficient to cause said saturation;

(c) said bi-directional drive circuit being further configured to selectively partially desaturate said at least one magnetic domain using said head and said memory select circuit, said drive circuit causing current to flow in a second direction having a direction opposite that of said first direction through said head at a magnitude sufficient to lower the magnetic flux density of a selected of said at least one magnetic domain to an initial condition within a range of magnetic flux density levels between a zero-scale point and a full-scale point;

(d) said bi-directional drive circuit being further configured to selectively further desaturate said at least one magnetic domain using said head and said memory select circuit, said drive circuit causing current to flow in said second direction through said head at a magnitude sufficient to lower the magnetic flux of a selected of said at least one magnetic domain to a level within said range, said level corresponding to the magnitude of an analog input electrical signal received from said input circuit; and (e) a sensor mounted upon said head that responds to the magnitude of magnetic flux of one of said plurality of magnetic domains, said sensor producing an output electrical signal having a magnitude that corresponds to the level of magnetic flux of said respective magnetic domain.

5. The memory of claim 1 wherein said substrate comprises a plurality of separate magnetically saturable and desaturable magnetic domains at a corresponding plurality of distinguishable fixed locations wherein each said magnetic domain is polarized in the same direction solely for the purpose of identification of said magnetic domain as a cell available for saturation and desaturation.

6. The memory of claim 5 wherein said bi-directional drive circuit comprises a means of impressing a polarity on said discrete specific cell of a plurality of cells prior to the saturation and desaturation of said cells.

7. The memory of claim 3 wherein said rotatable substrate comprises a substrate rotating in such a fashion that said magnetic domains of said substrate move on absolutely predictable paths wherein said head may polarize each cell as well as may saturate and desaturate each cell when said rotating substrate causes individual cell locations to pass over said head at a time when a control circuit so directs said head.

8. The memory of claim 3 wherein said substrate rotates in such a fashion that said magnetic domains of said substrate move on absolutely predictable paths, and wherein said head may identify said magnetic domain locations by means of selectively sensing a polarized location and may selectively sense the level of magnetic saturation of an arbitrarily selected one of said magnetic domains of said distinguishable locations.

9. The memory of claim 1, further comprising:

a control circuit created with means for receiving and storing and transmitting predetermined numerical, alphanumeric, algorithmic, and other values and signals corresponding to any possible plurality of said magnetic field strengths to and from outside said memory by way of conductive circuits and to said bi-directional drive circuit and said plurality of sensors.

10. The memory of claim 1 wherein said input circuit, output circuit, bi-directional drive circuits, sensors, and magnetic domains are all made of superconductive materials.

11. The memory as recited in claim 4, wherein said sensor includes an analog-to-digital converter that outputs as said output electrical signal a digital signal having a binary numerical value.

12. The memory as recited in claim 4, wherein said input circuit includes a digital-to-analog converter that outputs an analog signal for storage in a selected magnetic domain of said plurality of magnetic domains.

13. The memory of claim 4, further comprising a control circuit created with means for receiving and storing and transmitting predetermined numerical, alphanumeric, algorithmic, and other values and signals corresponding to any possible plurality of said magnetic field strengths to and from outside said memory by way of conductive circuits and to said bi-directional drive circuit and said sensor.

* * * * *